US006869689B2

(12) United States Patent
Fujii et al.

(10) Patent No.: US 6,869,689 B2
(45) Date of Patent: Mar. 22, 2005

(54) JOINED STRUCTURES OF METAL TERMINALS AND CERAMIC MEMBERS, JOINED STRUCTURES OF METAL MEMBERS AND CERAMIC MEMBERS, AND ADHESIVE MATERIALS

(75) Inventors: Tomoyuki Fujii, Nagoya (JP); Mitsuru Ohta, Inazawa (JP); Tsuneaki Ohashi, Ogaki (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/846,277

(22) Filed: May 14, 2004

(65) Prior Publication Data

US 2004/0209108 A1 Oct. 21, 2004

Related U.S. Application Data

(63) Continuation of application No. 10/108,181, filed on Mar. 27, 2002, now Pat. No. 6,756,132.

(30) Foreign Application Priority Data

Mar. 29, 2001 (JP) ..................................... P2001-096241

(51) Int. Cl.$^7$ .......................... H01L 23/48; B22B 1/04; B22B 7/04; B32B 15/04
(52) U.S. Cl. ...................... 428/642; 428/598; 428/614; 428/62; 428/621; 428/669; 428/457
(58) Field of Search ................. 428/642, 598, 428/614, 620, 621, 689, 457

(56) References Cited

U.S. PATENT DOCUMENTS

| | | | |
|---|---|---|---|
| 4,159,075 A | 6/1979 | Ljung et al. | |
| 6,219,364 B1 | 4/2001 | Dei | |
| 6,280,584 B1 | 8/2001 | Kumar et al. | |
| 6,292,346 B1 | 9/2001 | Ohno et al. | |
| 6,462,928 B1 | 10/2002 | Shamouilian et al. | |

FOREIGN PATENT DOCUMENTS

| | | |
|---|---|---|
| JP | 03-003249 A1 | 1/1991 |
| JP | 08-277173 A1 | 10/1996 |
| JP | 10-209255 A1 | 8/1998 |

Primary Examiner—Deborah Jones
Assistant Examiner—Jason Savage
(74) Attorney, Agent, or Firm—Burr & Brown

(57) ABSTRACT

A joined structure of a metal terminal and a ceramic member has a joining layer between the terminal and the ceramic member. The joining layer has a metal adhesive layer containing at least indium metal. The invention further provides a joined structure of a metal member and a ceramic member. The metal member has a tip face and a side face. A hollow is formed in the ceramic member. A joining layer is formed between a bottom surface facing the hollow and the tip face of the member, and further formed between a side wall surface facing the hollow and the side face of the member. The joining layer has a metal adhesive layer containing at least indium metal.

7 Claims, 3 Drawing Sheets

(a)

(b)

JOINED STRUCTURES OF METAL TERMINALS AND CERAMIC MEMBERS, JOINED STRUCTURES OF METAL MEMBERS AND CERAMIC MEMBERS, AND ADHESIVE MATERIALS

CROSS REFERENCE TO RELATED APPLICATIONS

This application is a continuation of U.S. application Ser. No. 10/108,181, filed Mar. 27, 2002 now U.S. Pat. No. 6,756,132, and also claims the benefit of Japanese Application No. P2001-096,241, filed Mar. 29, 2001, the entireties of which are incorporated herein by reference.

BACKGROUND OF THE INVENTION

The present invention relates to a joined structure of a metal member, particularly metal terminal, and a ceramic member, and an adhesive material therefor.

Dense ceramics are noted as a base material for an electrostatic chuck. In the field of semiconductor producing systems, electrostatic chucks have been practically used as susceptors containing an electrode for applying high frequency power to generate plasma. In such a device for applying high frequency power, the electrode for applying high frequency power has been embedded in a substrate made of silicon nitride or alumina.

In such devices, it is necessary to embed a metal electrode in a ceramic substrate such as aluminum nitride, alumina or the like and to electrically connect the metal electrode to an outer connector for supplying electric power. The Applicants disclosed a process of producing a ceramic heater, an electrostatic chuck and an electrode system for applying high frequency voltage used for a semiconductor producing system (see Japanese Patent Laid-Open "Kokai" Numbers 277,173A/1996 and 209,255A/1998). In these applications, Applicants proposed the following process for producing a joined structure. A hole is formed in a ceramic substrate by machining to expose a part of a metal electrode that is embedded in the substrate. A metal terminal with the shape of a cylinder is inserted into the hole and its end face is adhered to the metal electrode by brazing.

The inventors have tried the following process for brazing a ceramic member and a metal terminal. In this process, a hollow or a blind hole is formed in a surface region of a ceramic member and the end face of a metal terminal is inserted into the hollow. A metal foil is interposed between the metal terminal and the inner wall surface of the ceramic member facing the hollow to obtain an assembly, which is then heated to join the terminal and member by brazing. In an actual production line, however, some problems were found in the step of cooling the ceramic member to room temperature after the brazing (heating) step. That is, cracks may occur in the ceramic member near the inner wall surface, particularly near the corner portions of the hollow of the ceramic member. Such cracks result in off-specification products and reduce the production yield.

SUMMARY OF THE INVENTION

It is an object of the invention to join a ceramic member and a metal member with a sufficiently high bonding strength and to prevent crack formation in the ceramic material constituting the ceramic member.

The present invention provides a joined structure of a metal terminal and a ceramic member. According to one embodiment, a joining layer is formed between the metal terminal and the ceramic member, wherein the joining layer comprises a metal adhesive layer containing at least indium.

According to another embodiment of the present invention, a joined structure of a metal member and a ceramic member is provided, wherein the metal member includes a tip face and a side face. A hollow is formed in the ceramic member, which has a side wall surface and a bottom surface both facing the hollow. A joining layer is formed between the bottom surface facing the hollow and the tip face of the metal member, and between the inner wall surface facing the hollow and the side face of the metal member. The joining layer comprises a metal adhesive layer containing at least indium.

According to the present invention, a ceramic member and a metal member may be joined with each other with a sufficiently high bonding strength and without crack formation in the ceramic material constituting the ceramic member.

DETAILED DESCRIPTION OF THE INVENTION

Figure 1:
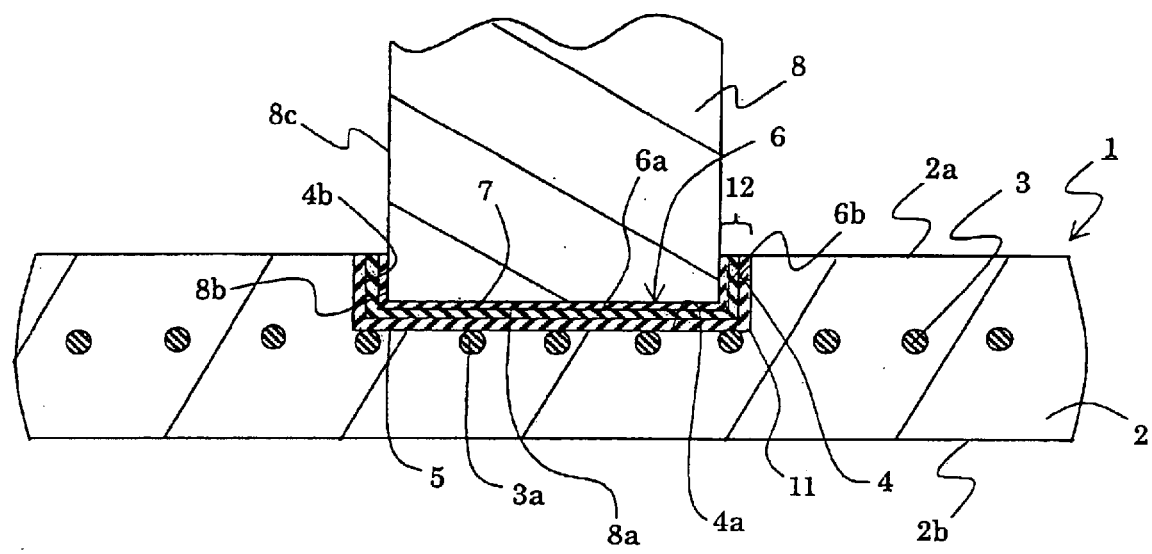
FIG. 1 is a cross sectional view showing a joined structure according to one embodiment of the invention.

The present invention will be further described referring to the attached drawings. FIG. 1 is a cross sectional view schematically showing a joined structure according to one embodiment of the present invention. A ceramic member 1 used in this embodiment is an electrostatic chuck also capable of functioning as an electrode for generating high frequency voltage. An electrode 3 for an electrostatic chuck made of an electrical conductor is embedded within a ceramic substrate 2. The electrode may preferably be embedded in a shaped body of ceramic powder and then subjected to a sintering process to produce the substrate 2 including the electrode 3 therein. 2b is an adsorption face and 2a is a back face of the substrate 2. A hollow 4 is formed on the side of the back face 2a. The hollow 4 is defined by a bottom surface 4a and a side wall surface 4b. A part of the electrode 3 is exposed to the bottom surface 4a facing the hollow 4 to form an exposed portion 3a.

In this embodiment, an intermediate layer 5 is formed facing the hollow 4 so as to cover the bottom surface 4a and side wall surface 4b. A metal terminal 8 has a tip face 8a and a side face 8c. The tip portion of the terminal 8 is inserted into the hollow 4. The tip portion 8b of the side face 8c and tip face 8a of the terminal are covered with a metal film 7. A portion of the joining layer 12 is formed facing the hollow 4 between the tip face 8a of the terminal 8 and the bottom surface 4a, and the joining layer 12 includes the intermediate layer 5, a metal adhesive layer 6a and the metal film 7. A portion of the joining layer 12 is also formed between the side face 8b of the terminal 8 and the side wall surface 4b facing the hollow 4, and the joining layer 12 includes the intermediate layer 5, a metal adhesive layer 6b and the metal film 7. The joining layer 12 contacts and is joined with the exposed portion 3a of the electrode 3.

As described above, a joining layer having a metal adhesive layer containing at least metal indium is formed between a metal terminal and a ceramic member, according to the present invention. According to the experimental results, it is possible to join a ceramic member and a metal terminal with a sufficiently high bonding strength and to prevent the formation of cracks in the ceramic material to improve production yield. Moreover, when supplying electric power to the metal terminal, it is also possible to prevent excessive heat generation and to reduce temperature increases resulting from heat generation in the joining portion of the metal terminal and the ceramic member.

The present invention provides a sufficiently high bonding strength between a metal terminal and ceramic member and prevents bonding defects due to crack formation in the ceramic material. The reasons may be speculated as follows. Metal indium has a melting point of about 160° C., and thus needs a relatively low temperature for brazing. Such a low brazing temperature results in a low stress due to the differential thermal expansion (shrinkage) of the metal adhesive and the ceramics during a cooling step after the heating step. For example, as shown in FIG. 1, the differential thermal expansion between a metal brazing or adhesive and the ceramic tends to induce a stress concentration near the corner portion 11 of the hollow 4 and cracks may form from the corner portion 11 extending inwardly in the substrate 2. A metal brazing material containing indium, however, may be effective for preventing such crack formation by reducing the stress concentration. Moreover, metal indium has a relatively low hardness, and thus tends to induce fracture in the brazing metal containing indium and helps to prevent the stress concentration in the ceramics. Metal indium is thus advantageous for preventing the formation of cracks or fracture in the ceramics. The effects may be synergistic for preventing the formation of cracks or fracture in the ceramic material, or for preventing bonding defects by relaxing stress in the ceramic material due to the low hardness of metal indium.

When electrical resistance is high or contact failure occurs at the interface of a brazing metal and a ceramic substrate, however, excessive and local heat generation might be induced. However, according to experimental results, when supplying high frequency electric power to the metal terminal, heat generation along and near the interface between the metal terminal and ceramic member was relatively small. In such cases, excessive or rapid heat generation, which may adversely affect the stability of indium, has not been observed.

According to another aspect of the invention, a hollow may be formed in a ceramic member, and the joining layer of the present invention may be interposed between the bottom surface facing the hollow and the tip face of the metal member and between the side wall surface facing the hollow and the side face of the metal member, respectively. According to such a structure, the ceramic member and the conductive member were joined with a sufficiently high strength and the crack formation was reduced at the same time to successfully improve a production yield. The reasons are not clearly understood, however, it is speculated that the formation of cracks starting from the corner portion 11 or near, frequently observed in prior structures, may be prevented by the present invention.

By the way, it has been proposed to join an electrostatic chuck with a water-cooling type metal cooling plate by metal bonding (Japanese Patent Laid-Open "Kokai" Number 3249A/1991). According to the technique disclosed in that application, an electrostatic chuck made of alumina and a water-cooling type cooling plate made of aluminum are joined with metal indium. That is, metal indium is used for bonding the metal water cooling plate. Such a metal cooling plate is constantly cooled by flowing water such that its surface temperature is kept low. Therefore, it is technically feasible to bond the metal cooling plate to the back face of the electrostatic chuck using metal indium, even if indium has a low melting point (about 160° C.). It has not been conceivable to apply metal indium, with such a low melting point, to bond a metal terminal, however, since heat generation is usually or inevitably induced.

According to a preferred embodiment of the present invention, when bonding a metal terminal and a ceramic member, a hollow is formed in the ceramic member and a joining layer is interposed between the metal terminal and at least a part of the inner surface facing the hollow. More preferably, the metal terminal has a tip face and a side face, and the joining layer is interposed between the bottom surface facing the hollow and the tip face of the terminal and between the side wall surface facing the hollow and the side face of the terminal. It is thereby possible to effectively prevent the crack formation starting from the corner portion of the hollow extending inwardly in the ceramic member.

The material of a ceramic member is not particularly limited. In an application where a ceramic member is to be exposed to a corrosive gas containing a halogen element, particularly a fluorine element, the material is preferably a ceramic material containing aluminum, such as aluminum nitride, alumina or sialon. Alternatively, the material may preferably comprise a nitride ceramic such as aluminum nitride, silicon nitride or sialon, and a carbide ceramic such as silicon carbide. The material may also be an oxide ceramic such as zirconia, alumina or the like.

The material for the metal member or the metal terminal is not particularly limited. In an application where the ceramic member is to be exposed to a corrosive gas containing a halogen element, particularly fluorine element, the metal is preferably nickel, molybdenum, tungsten, platinum, rhodium and the alloys of these metals.

According to one embodiment of the present invention, electric power may be directly supplied to the ceramic constituting the ceramic member through a metal terminal to give current flow. In a preferred embodiment, however, the ceramic member has a conductive member electrically connected with a metal terminal. The conductive member may be mounted and fixed on the ceramic substrate. In a preferred embodiment, however, the conductive member is embedded within a ceramic material constituting the ceramic member.

The material of the conductive member is not particularly limited. In an application where the ceramic member is exposed to a corrosive gas containing a halogen element, particularly fluorine element, the material of the conductive member is preferably nickel, molybdenum, tungsten, platinum, rhodium or the alloys of these metals. When the conductive member is embedded within the ceramic member, the material of the conductive member is preferably be molybdenum, tungsten, platinum, rhodium or the alloys of these metals, and more preferably be molybdenum, tungsten or the alloys thereof.

According to a preferred embodiment, the conductive member is exposed to an inner surface facing the hollow of the ceramic member and the exposed portion of the conductive member contacts the joining layer. The joining layer may be joined with the ceramic material constituting the ceramic member and may further contact and join with the conductive member. As a result, the bonding strength of the ceramic member and the metal member may be further improved. Even when the wettability of metal indium on the ceramic member is low, the ceramic and metal members may be joined with a feasible bonding strength.

The metal adhesive layer is composed of metal indium or an alloy containing at least indium. In other words, the adhesive layer is substantially composed of metal indium (pure indium) or composed of an alloy of indium and one or more metal other than indium. The adhesive layer is preferably substantially made of indium. Inevitable impurities derived from raw materials, however, and a small amount, for example not higher than 2 weight percent, of impurities are acceptable.

In an embodiment where the metal adhesive layer is made of an alloy of indium and another metal, the content of indium in the alloy is preferably higher in order to obtain the effects of the present invention. Further, the content of indium in the alloy is preferably not lower than 80 weight percent and more preferably not lower than 95 weight percent. The upper limit of the indium content is not particularly limited, and a higher content is better.

Alternatively, the melting point of the alloy is preferably low, for example, not higher than 300° C. and more preferably not higher than 200° C. The metal other than indium is not particularly limited and includes nickel, titanium, copper, gold, platinum and palladium.

In a preferred embodiment, the metal terminal functions as a terminal for applying high frequency voltage on thee conductive member. The joined structure according to the invention is advantageous for preventing excessive heat generation when high frequency voltage is supplied through the metal terminal.

DC voltage supplied to an electrode of an electrostatic chuck does not induce excessive heat generation. In an electrostatic chuck of a self-bias system generally used in an etcher, however, high frequency current is applied to its electrode to accelerate plasma that is generated over a wafer so that the accelerated plasma physically attacks the wafer. Alternatively, when an electrostatic chuck adsorbs a wafer by Johnson-Rahbek force, leak current flows through its ceramic substrate, the metal terminal and joining layer. It is thus required that the joining portion of the terminal has a low resistance, because the joining portion or its neighboring portion with a high resistance may result in considerable heat generation. Such a possibility of excessive heat generation in the joining portion would have prevent those skilled in the art from the conception of joining the metal terminal with a low melting point metal such as indium.

The conductive member embedded in a ceramic member is not particularly limited. In a preferred embodiment, the conductive member embedded in the ceramic member is a planar and bulky body. The term "planar and bulky body" includes a planar and bulky body made of any material such as wires or an elongate planar body. For example, a wire or an elongate planar body may be shaped to produce a planar body, without shaping them in a spiral or zigzag form. The conductive member may be a metal plate, or wire netting or gauze composed of metal wires knit along a plane, or a plate with a number of small holes formed therein. Such a member may be punched metal, etched metal, wire mesh, felt or non-woven fabric.

In a preferred embodiment, the joining layer has an intermediate layer between the metal adhesive layer and ceramic member. The intermediate layer is made of a noble metal, aluminum, nickel, or the alloys thereof. Such a layer is effective for improving the wettability of the metal adhesive on the ceramic member. The noble metal is preferably copper or gold.

The depth of the hollow is not particularly limited. The depth is preferably not less than 0.5 mm and more preferably not less than 1.0 mm, for preventing the crack formation starting from the corner portion of the hollow. Although the upper limit of the depth of the hollow is not particularly defined, the depth is preferably not larger than 20 mm for improving production efficiency.

The surface area of the hollow is not particularly limited. The surface area is preferably not smaller than 5 mm$^2$ and more preferably not smaller than 15 mm$^2$, for reducing temperature increases in the joining portion. When the hollow is circular in a plan view, the diameter of the hollow is preferably not smaller than 3 mm and more preferably not smaller than 6 mm.

Figure 2:
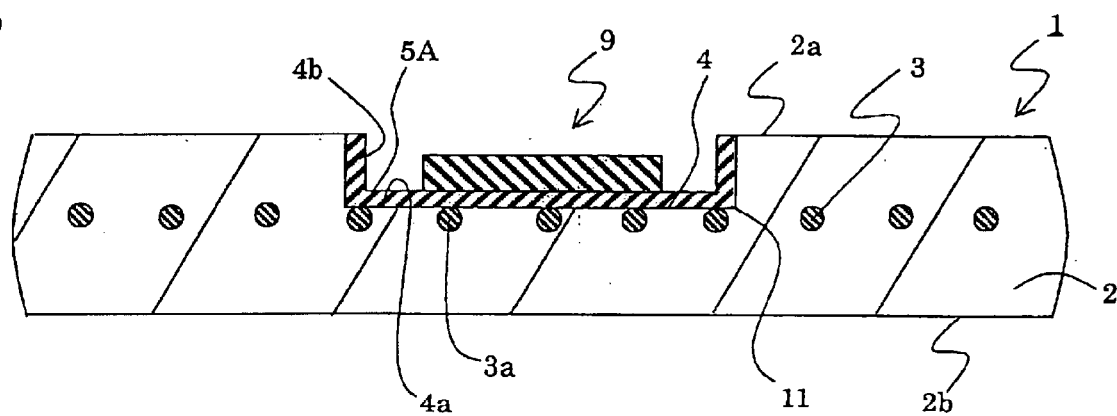
FIG. 2(a) is a cross sectional view showing a ceramic substrate 2 with a hollow 11 formed therein, in which a metal film 5A is formed and a metal adhesive 9 is set.
FIG. 2(b) is a cross sectional view showing a ceramic substrate 2 with a hollow 11 formed therein, in which the metal adhesive 9 is melted on the metal film 5A.
Figure 2:
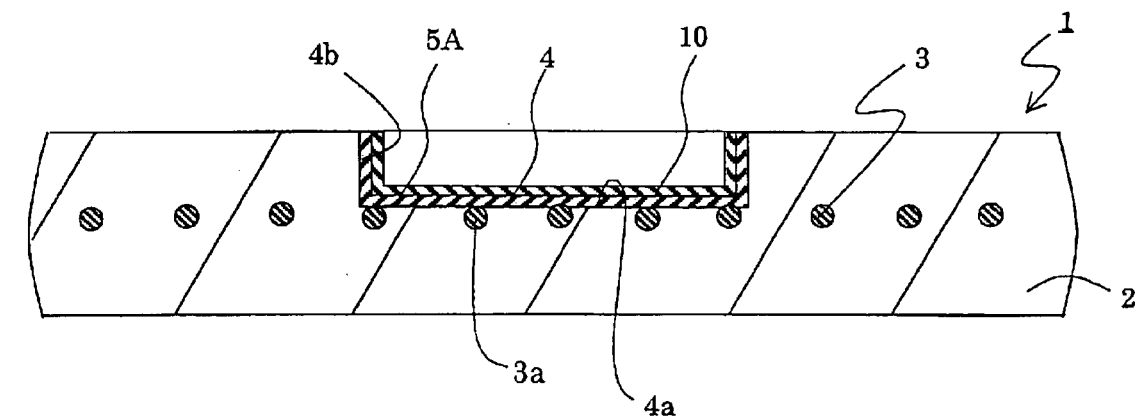

An example of producing a joining structure according to the invention will be described below. A metal adhesive material containing at least metal indium is mounted on the surface of a ceramic member. The adhesive material is preferably set in a hollow formed in the ceramic member. For example as shown in FIG. 2(a), a hollow 4 is formed in a substrate 2 of a ceramic member 1. A part 3a of a conductive member 3 embedded in the substrate 2 is exposed to the hollow 4. An adhesive material 9 is set and fixed in the hollow 4. The adhesive material 9 may be a sheet, powder, or paste made by mixing a powder and a binder.

In this embodiment, a metal film 5A is preferably formed on a surface to be joined, particularly a bottom surface 4a and a side wall surface 4b facing the hollow 4 of the ceramic member. The metal film usually remains as an intermediate layer 5 after a joining process (see FIG. 1). The metal film may be formed by a gaseous phase process (for example, chemical vapor deposition or sputtering), or a liquid phase process (electrolytic plating, electroless plating or the like). In particular, the surface to be joined of ceramics may be easily covered with electroless plating.

Alternatively, it is possible to form a metal film on the surface to be joined by dispersing a metal powder into an organic binder to produce a paste, applying the paste, and drying the applied paste to remove the organic binder. Further, a metal film may be formed by contacting a metal foil with the surface. The thickness of the metal film 5A is preferably in a range of 0.1 to 20 µm.

Further, another metal film substantially the same as the metal film 5A may be formed on the surface of the metal terminal or metal member.

At least the metal adhesive 9 is then heated and melted. As shown in FIG. 2(b), the molten metal adhesive 10 wets the surface of the metal film 5A. For heating at least the metal adhesive 9, the entire ceramic member may be subjected to heat treatment. Alternatively, only the region of the metal adhesive 9 may be heated by using a local heating means such as high frequency radiation or laser ray radiation.

The molten metal adhesive 10 is then preferably processed using a supersonic trowel so as to remove an oxide film formed on the surface of metal indium and thus improve the wettability of the molten adhesive to the ceramic member. Alternatively, the molten metal adhesive 10 may preferably contact the surface of the metal member to wet the surface. The tip portion of the metal member is then inserted into the hollow, and the metal member is fixed so as not to incline using a jig to obtain an assembly. The assembly is then cooled with a load applied on the metal member, preferably in a direction perpendicular to the surface to be joined. The joining process of this example is thus completed.

Figure 3:
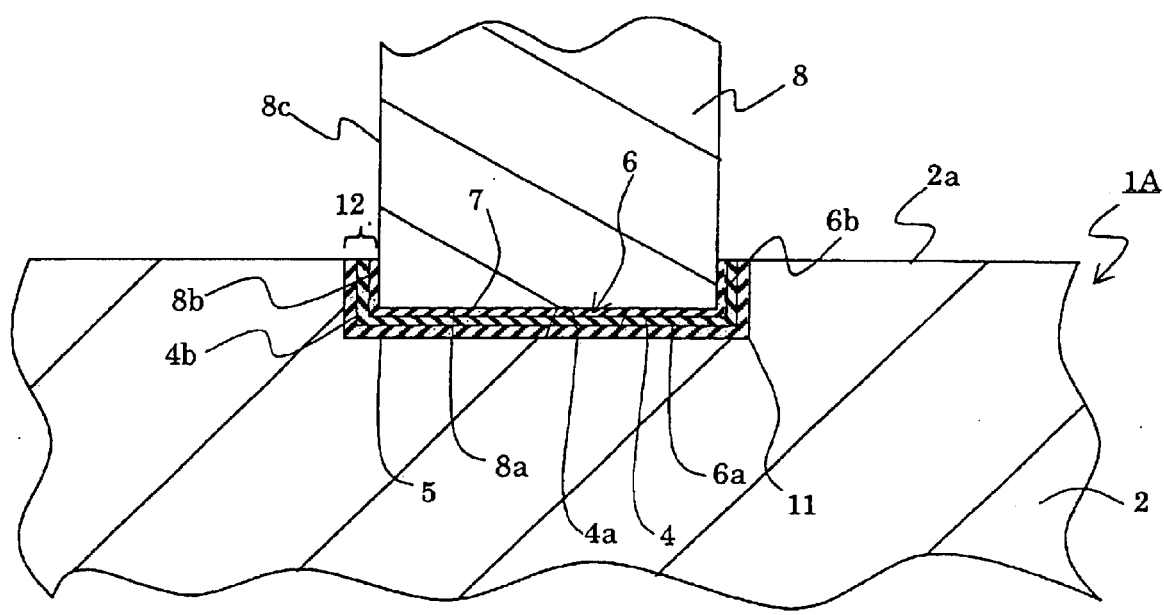
FIG. 3 is a cross sectional view showing a joined structure according to another embodiment of the present invention.

FIG. 3 is a cross sectional view showing a joined structure according to another embodiment of the present invention. The ceramic member 1A of this embodiment does not include the conductive member as described above and is mainly composed of the ceramic substrate 2.

In this embodiment, the ceramic substrate 2 has a predetermined conductivity so that high frequency electric power may be supplied to the substrate 2. Alternatively, the substrate 2 may be made of an insulating ceramic material.

EXAMPLES

Experiment A

A ceramic electrostatic chuck was produced and a sample for a tensile test was cut therefrom. That is, aluminum nitride powder was filled in a mold and sealed with a carbon foil. A metal mesh was embedded in the aluminum nitride powder. The mesh is obtained by knitting molybdenum wires having a diameter of 0.12 mm at a density of 50 wires per inch. The aluminum nitride powder with the mesh therein was hot press sintered to a maximum temperature of 1950° C. under a pressure of 200 kg/cm$^2$ for a holding time period of 2 hours at 1950° C. to produce a sintered body. The sintered body had a relative density of not lower than 98.0 percent. The mesh was embedded within the sintered body so that the mesh may function as an electrode for electrostatic chuck. A ceramic member, with a length of 20 mm, a width of 20 mm and a thickness of 2 mm, was cut out from the sintered body. A circular hollow 4 with a diameter of 6 mm and a depth of 1 mm was formed in the central portion of the ceramic member. A part of the embedded electrode (metal mesh) was exposed to the bottom surface facing the hollow 4. The tip face of a molybdenum terminal had a diameter of 5.90 mm.

The ceramic member and the molybdenum terminal were joined as described referring to FIGS. 2(a) and 2(b). That is, a nickel plating layer with a thickness of 5 μm was formed on the bottom surface 4a and side wall surface 4b facing the hollow 4, by electroless plating. A nickel plating layer with a thickness of 2 μm and a gold plating layer with a thickness of 2 μm were formed, in this order, on the tip face and side face of the tip portion of the molybdenum terminal 8. A block of metal indium with a weight of about 0.4 grams was set in the hollow 4. The substrate 2 and terminal 8 were then heated by a hot plate to about 200° C. After the block of indium was completely molten, an ultrasonic solder trowel was used to remove indium oxide film that formed on the metal indium to wet the bottom surface 4a and side wall surface 4b facing the hollow 4 with the melt of metal indium. At the same time, an ultrasonic solder trowel was used to wet the tip and side faces of the terminal with the molten metal indium. The tip portion of the terminal was then inserted into the hollow. The terminal was then fixed by means of a jig so as to prevent the inclination of the terminal. The assembly was then cooled under a load of 500 g applied perpendicularly on the terminal.

Four samples were produced as described above. Each sample joined body was subjected to visual evaluation for the presence of cracks in the joining layer and ceramic member. As a result, cracks were not observed in each of the samples.

A tapped hole of M4 with a depth of 2 mm was formed in the central portion of each metal terminal 8 for performing a tensile test of each joined body. Each tapped hole formed in each terminal joined with the substrate 2 was pulled upwardly to measure a breaking load. As a result, the average of the measured breaking load was 20.86 kgf. Each of the joined bodies was broken at a point in metal indium.

Experiment B

The same ceramic member and metal terminal as those used in Experiment A were joined with each other to produce four samples. However, the following three conditions were different from those applied in Experiment A. That is, an aluminum solder was used, and the solder was heated at 610° C. and under vacuum. Consequently, cracks were confirmed by visual evaluation within AlN in all of the four samples.

Experiment C

The same ceramic member and metal terminal as those used in Experiment A were joined with each other to produce four samples. However, the following three conditions were different from those applied in Experiment A. That is, a solder of Ag—Cu—Ti system was used, and the solder was heated at 850° C. and under vacuum. Consequently, cracks were confirmed by visual evaluation within AlN in all of the four samples.

Experiment D

An electrostatic chuck was produced. That is, a mesh obtained by knitting molybdenum wires with a diameter of 0.12 mm at a density of 50 wires per inch was embedded in a primary shaped body of aluminum nitride powder. The primary shaped body was then set in a mold and sealed with a carbon foil. The primary shaped body with the mesh therein was hot press sintered to a maximum temperature of 1950° C. under a pressure of 200 kg/cm$^2$ for a holding time period of 2 hours at 1950° to produce a sintered body. The sintered body had a relative density of not lower than 98.0 percent, a diameter of 200 mm and a thickness of 2 mm. The mesh was embedded within the sintered body so that the mesh may function as an electrode for an electrostatic chuck. The back face of the resulting sintered body was processed using a machining center to form a hollow 4, with a depth of 1 mm and a diameter of 3 mm, 6 mm or 10 mm. A part 3a of the mesh-shaped electrode 3 was exposed to the bottom surface 4a facing the hollow 4. Three kinds of metal terminals with diameters of 2.95 mm, 5.90 mm and 9.80 mm, respectively, were used corresponding to the three kinds of hollows 4 with the different diameters as described above. The electrostatic chuck and the molybdenum terminal were joined with each other, according to the substantially same process described above with respect to Experiment A.

Joined bodies were produced as described above. Each sample joined body was subjected to visual evaluation for the presence of cracks in the joining layer and ceramic member. As a result, cracks were not observed in each of the samples.

Each tapped hole formed in each terminal joined with the fixed substrate 2 was pulled upwardly to measure a breaking load, as described in Experiment A. The measured breaking load was 10.6 kgf for the 3 mm diameter hollow 22.5 kgf for the 6 mm diameter hollow, and 30.4 kgf for the 10 mm diameter hollow. Each of the joined bodies was broken at a point in metal indium.

Further, a high frequency current of 40 amperes and a frequency of 13.5 Hz were supplied to each molybdenum terminal to measure the temperature difference of the terminal 8 and its neighboring portion. As a result, a difference was 10.5° C. for the 3 mm diameter hollow, 2.2° C. for the 6 mm diameter hollow and not larger than 0.5° C. for the 10 mm diameter hollow.

As described above, according to the present invention, a ceramic member and a metal member may be joined with each other with a sufficiently high bonding strength and crack formation in the ceramic material constituting the ceramic member is prevented.

What is claimed:

1. An adhesive material joining a metal terminal and a ceramic member, said adhesive consisting essentially of a metal adhesive containing at least indium.

2. The adhesive material of claim 1, wherein at least 80 weight percent of said metal adhesive consists essentially of indium.

3. The adhesive material of claim 2, wherein said metal consists essentially of indium.

4. The adhesive material of claim 1, wherein said metal adhesive consists essentially of an alloy containing indium and one or more metals other than indium.

5. The adhesive material of claim 4, wherein said alloy has a melting point that is not higher than 300° C.

6. A metal terminal for applying a high frequency voltage joined to a ceramic member via the adhesive material of claim 1.

7. An adhesive material joining a metal terminal and a ceramic member, said adhesive material consisting essentially of an alloy containing indium and at least one metal other than indium, wherein said at least one metal other than indium is selected from the group consisting of nickel, titanium, copper, gold, platinum and palladium.

* * * * *

UNITED STATES PATENT AND TRADEMARK OFFICE
CERTIFICATE OF CORRECTION

PATENT NO. : 6,869,689 B2
DATED : March 22, 2005
INVENTOR(S) : Tomoyuki Fujii, Mitsuru Ohta and Tsuneaki Ohashi It is certified that error appears in the above-identified patent and that said Letters Patent is hereby corrected as shown below:

Column 9,
Line 13, please add -- adhesive -- after "metal"

Signed and Sealed this

Twenty-fourth Day of May, 2005

JON W. DUDAS
*Director of the United States Patent and Trademark Office*